(12) United States Patent
Fitch et al.

(10) Patent No.: US 6,208,513 B1
(45) Date of Patent: Mar. 27, 2001

(54) INDEPENDENTLY MOUNTED COOLING FINS FOR A LOW-STRESS SEMICONDUCTOR PACKAGE

(75) Inventors: John S. Fitch, Newark; William R. Hamburgen, Palo Alto, both of CA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 08/373,718

(22) Filed: Jan. 17, 1995

(51) Int. Cl.[7] ...................................................... H05K 7/20
(52) U.S. Cl. ...................... 361/704; 165/80.2; 165/185; 174/16.3; 257/713; 257/722; 361/718
(58) Field of Search .................................. 165/80.2, 80.3, 165/185; 174/16.3; 57/706, 707, 712–713, 722; 631/688, 690, 704, 707, 709–710, 714–718, 722, 723

(56) References Cited

U.S. PATENT DOCUMENTS

| | | | |
|---|---|---|---|
| 4,204,246 | 5/1980 | Arii et al. | 361/385 |
| 4,546,405 | * 10/1985 | Hultmark et al. | 361/704 |
| 4,630,172 | 12/1986 | Stenerson et al. | 361/386 |
| 4,682,269 | * 7/1987 | Pitasi | 361/704 |
| 5,155,579 | * 10/1992 | Au Yeung | 174/16.3 |
| 5,177,669 | * 1/1993 | Juskey et al. | 361/704 |
| 5,199,165 | 4/1993 | Crawford et al. | 29/846 |
| 5,216,580 | 6/1993 | Davidson et al. | 361/385 |
| 5,265,321 | * 11/1993 | Nelson et al. | 361/718 |
| 5,296,740 | 3/1994 | Sono et al. | 257/706 |
| 5,349,237 | 9/1994 | Sayka et al. | 257/715 |
| 5,450,283 | * 9/1995 | Lin et al. | 361/722 |

FOREIGN PATENT DOCUMENTS

2073697 * 3/1990 (JP) ..................................... 361/706

* cited by examiner

*Primary Examiner*—Gregory Thompson
(74) *Attorney, Agent, or Firm*—Oppenheimer Wolff & Donelly LLP

(57) ABSTRACT

In a semiconductor package, a die has electrical circuits formed on a first side surface. A lead frame for connecting the electrical circuits to a power source is connected to the electrical circuits of the die. A package body made of a dielectric material is formed around the die and the lead frame. One or more fins made of a thermally conductive material are independently attached to the die by a thermally conductive bond. The fins, receive heat directly from the die, and dissipate the heat by radiative or convection cooling into the surrounding environment.

5 Claims, 13 Drawing Sheets

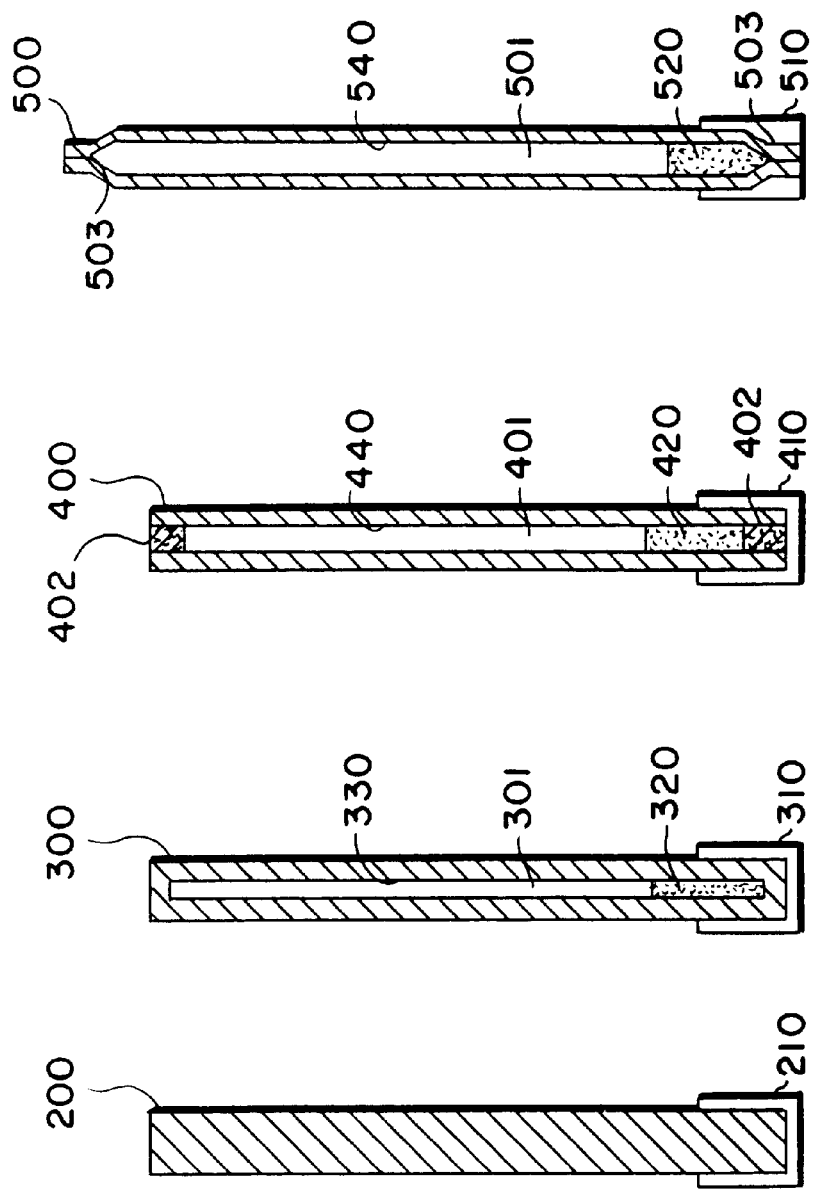

INDEPENDENTLY MOUNTED COOLING FINS FOR A LOW-STRESS SEMICONDUCTOR PACKAGE

FIELD OF THE INVENTION

The present invention relates generally to semiconductor packages, and particularly to semiconductor packages cooled to an external environment by fins.

BACKGROUND OF THE INVENTION

As semiconductor circuits continue to increase in complexity, so does their power consumption, and consequently, the amount of heat that is generated. Conventional semiconductor circuits are formed on a die. The die and a lead frame to electrically connect to the circuits are embedded in a an insulating plastic or ceramic package.

Traditionally, a heat sink is used to cool the package. The heat sink is typically configured with a mounting base and perpendicular, or parallel fins. The mounting base can be attached to the package using thermally conductive adhesives, conformable, thermally conductive adhesive tapes, or conformable, thermally conductive liquids or greases, with or without pressure to form a thermally conductive joint.

In a traditional semiconductor package, the heat path is, indirectly, from the die, through the package, through the thermal joint, through the heat sink base, and finally into the fins where the heat can be dissipated into a surrounding environment by convection or radiative cooling.

There are several problems with such traditional semiconductor packages. A substantial portion of the heat path is through the package material, or other laminate layers, such as adhesives, which are usually poor conductors of heat. In addition, the differences between the thermal expansion characteristics of the package and the heat sink can warp the components to varying degrees. The warped components mechanically stress the package and tend to decrease the effectiveness of the bond.

Therefore, it is desired to improve the reliability and performance of semiconductor package cooling techniques. In addition, it is desired that the improved packaging techniques reduce the size, weight, cost, number of parts, and the number of manufacturing steps used to assemble the package.

SUMMARY OF THE INVENTION

A semiconductor die has electrical circuits formed on a first side surface. The opposing second side surface is usually electrically nonfunctional. The electrical circuits of the die can be connected to power and signalling sources by a lead frame, tape bonding, or wire bonds. A package body made of a dielectric material is formed around the die and lead frame. One or more fins made of a thermally conductive material are independently attached the package by a thermally conductive bond to provide a direct thermally path between the package and the fins. If the non-functional side of the die is exposed external to the package, the fins may be attached to the die. If the die includes a metalized layer, the fins can be attached by soldering or brazing. In an alternative configuration, the fins can be molded onto the die.

BRIEF DESCRIPTION OF THE DRAWINGS

FIGS. 2–5 are cross-sectional views of fins of the package of FIG. 1;

DETAILED DESCRIPTION OF PREFERRED EMBODIMENTS

Figure 1:
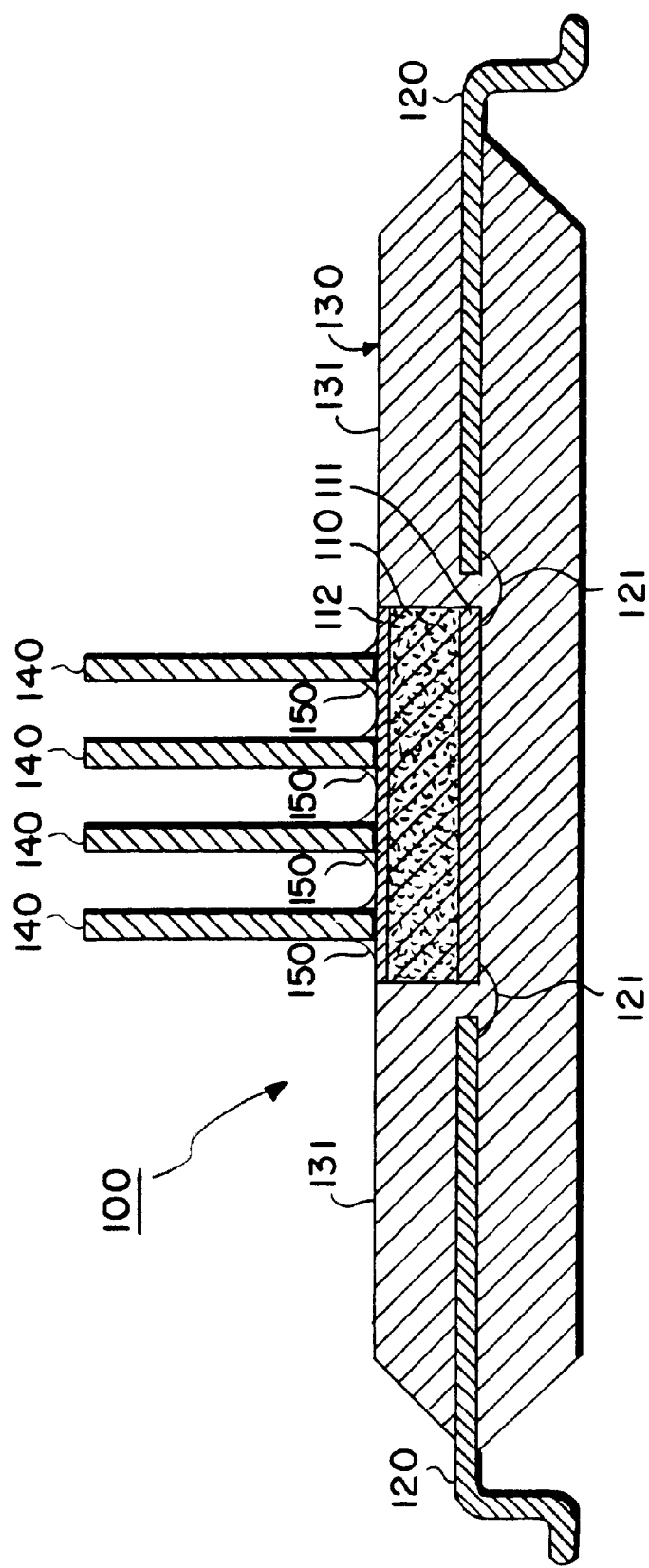
FIG. 1 is a cross-sectional view of a semiconductor package according to a preferred embodiment of the invention.

Shown in FIG. 1 is a semiconductor package 100 according to a preferred embodiment of the invention. A semiconductor die 110 has electrical circuits 111 formed on a first side thereof. The die 110 can be made of a silicon substrate. A second opposing side of the die 110 can, in one embodiment of the invention, include an optional metalized layer 112. If the die includes the metalized layer 112, it can be deposited on the die 110 by vacuum sputtering, or similar metal-to-substrate depositing techniques. A lead frame 120 is connected to the circuits 111 of the die 110 by bond wires 121 using a wire-bonding technique.

The lead frame 120, the bond wires 121, and the die 110 can be mounted in a dielectric package 130 so that the metalized layer 112 of the die 110 is externally exposed. The dielectric package 130 can be made, for example, of a molded resin, or plastic material, or a fused ceramic material.

One or more fins 140 are independently attached to the die 110 by attachment means 150, such as thermally conductive adhesives. The fins dissipate heat by radiative, or convection cooling into the surrounding environment. If the die 110 includes the metalized layer 112, metal-to-metal bonding techniques, such as brazing or soldering can be used.

The cross-sectional dimensions of each attachment means 150 is substantially the same as the cross-sectional dimensions of each fin 140, and relatively small, when compared with traditional base-mounted heat-sinks. This results in a low-stress thermal joint which is less likely to be subject to shear forces, and does not require massive screws or clamps to hold the fins to the package, as found in some prior art packages.

During assembly of the package 100, the fins 140 are held in position relative to the die 110 by a holding fixture, not shown. If the attachment means 150 is an adhesive joint, the fins 140 are held in place until the adhesive is cured. For a solder joint, the fins 140 can be heated to a temperature which causes the solder 150 to reflow, at which time the heat is removed, and the solder 150 is allowed to solidify. Brazing can be performed similarly while holding the fins 140 in place.

During operation of the semiconductor package 100, an electric current is supplied to the circuits 111 of the die 110 via the lead frame 120 and the bond wires 121. The electrical operation of the circuits 111 generates heat. The heat is conducted from the die 110 directly to the independently attached fins 140. The fins 140 dissipate the heat to the surrounding environment by radiative or convection cooling.

This arrangement reduces the number of components through which the heat must travel before the heat is dissipated, e.g. from the die, to the fins. In addition, the heat path from the die to the fins consists entirely of thermally conductive materials.

FIGS. 2–5 show various styles of fins that can be independently attached to the die 110 of FIG. 1. FIG. 2 shows a fin 200 made of a solid stock having a round or square cross-section, for example. The stock can be aluminum, copper, graphite, or any other substance having suitable thermal conductive characteristics. The stock can be prepared for attachment by fixing an adhesive or solder 210 to one end of the fin 200.

FIG. 3 shows a fin 300 made of a hollow stock having an interior surface to form a cavity 301. FIG. 4 shows a fin 400 made of a tubular stock with plugs 402 sealing the ends of the cavity 401. In FIG. 5, a fin 500 has ends 503 crimped to form a cavity 501. The fins 200, 300, 400, and 500 include, respectively, attachment means 210, 310, 410, and 510.

The cavities 301, 401, and 501 can be partially filled with materials 320, 420, 520 which undergo a phase change over the operating temperature ranges of the fins, effectively making the fin 300, 400, or 500 heat pipes. For example, the inner surface of the cavities can be coated with wicking materials 330, 430, 530 to facilitate the capillary behavior of the heat pipe. Thus, if the phase change material is water, for example, the conducted heat will evaporate the water. The cooler portion of the fin can condense the water vapor, which can then flow back to the warmer portion of the fin. Alternatively, the cavities can be filled by a solid-to-liquid, or solid-to-solid phase change material to acquire heat.

Figure 6:
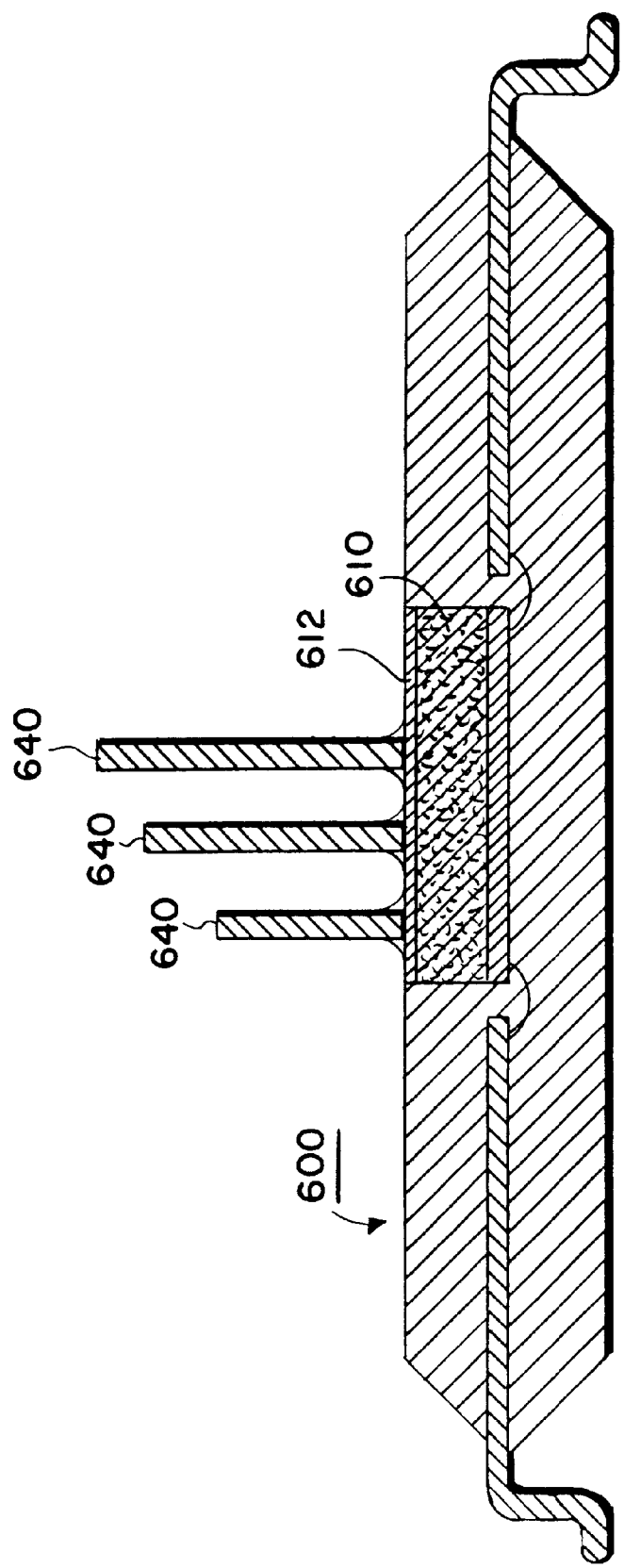
FIG. 6 is a cross-sectional view of the package with an alternative arrangement of the fins of FIG. 2.

FIG. 6, in an alternative embodiment, shows fins 640 of various sizes, number, and location attached independently to a die 610 or a surface 631 of a package 600. In this arrangement, the fins 640 can be proportionally sized and located on those portions of the die 610 in accordance with the power distribution to the circuits of the die 610, which is generally known. Thus, the resultant heat gradient can be controlled to maximize the performance of the circuits.

Figure 7:
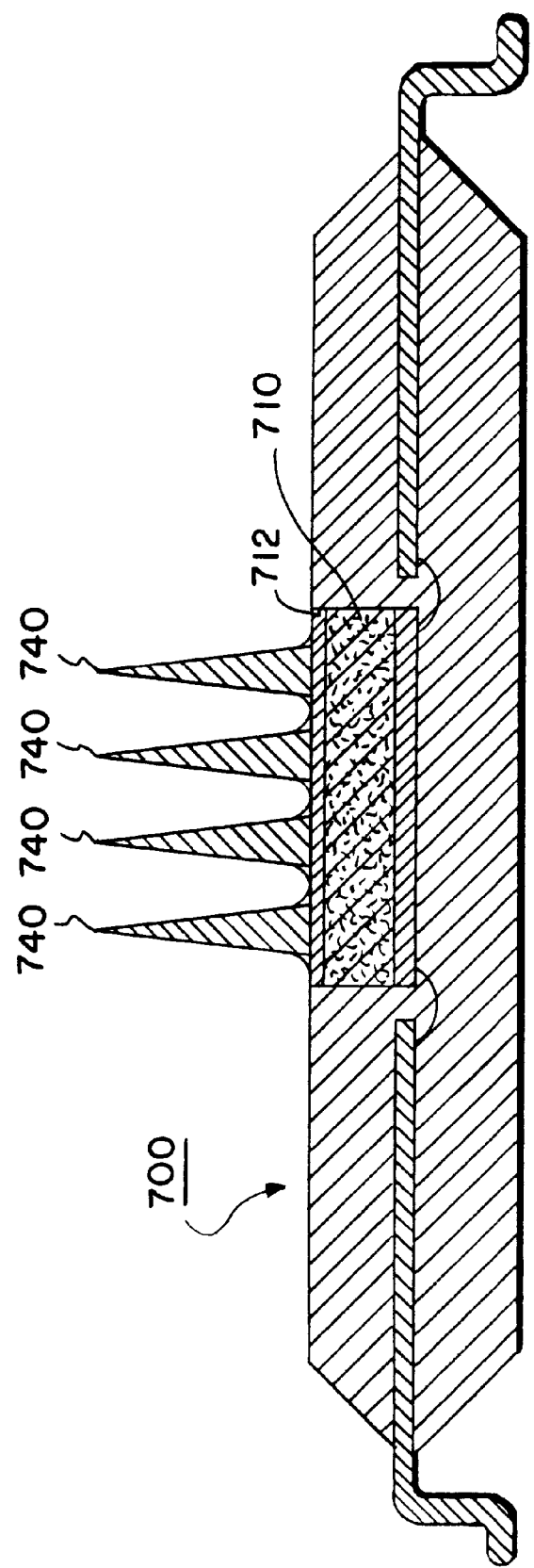
FIG. 7 is a cross-sectional view of the package with alternative shapes of the fins of FIG. 2.

In another embodiment of the invention, as shown in FIG. 7, the shape of fins 740 of a package 700 is varied. For example, the portions of the fins 740 near a die 710 have a larger cross-sectional dimension to accommodate a greater rate of heat flow. The die 710 can include a metalized layer 712.

Figure 8:
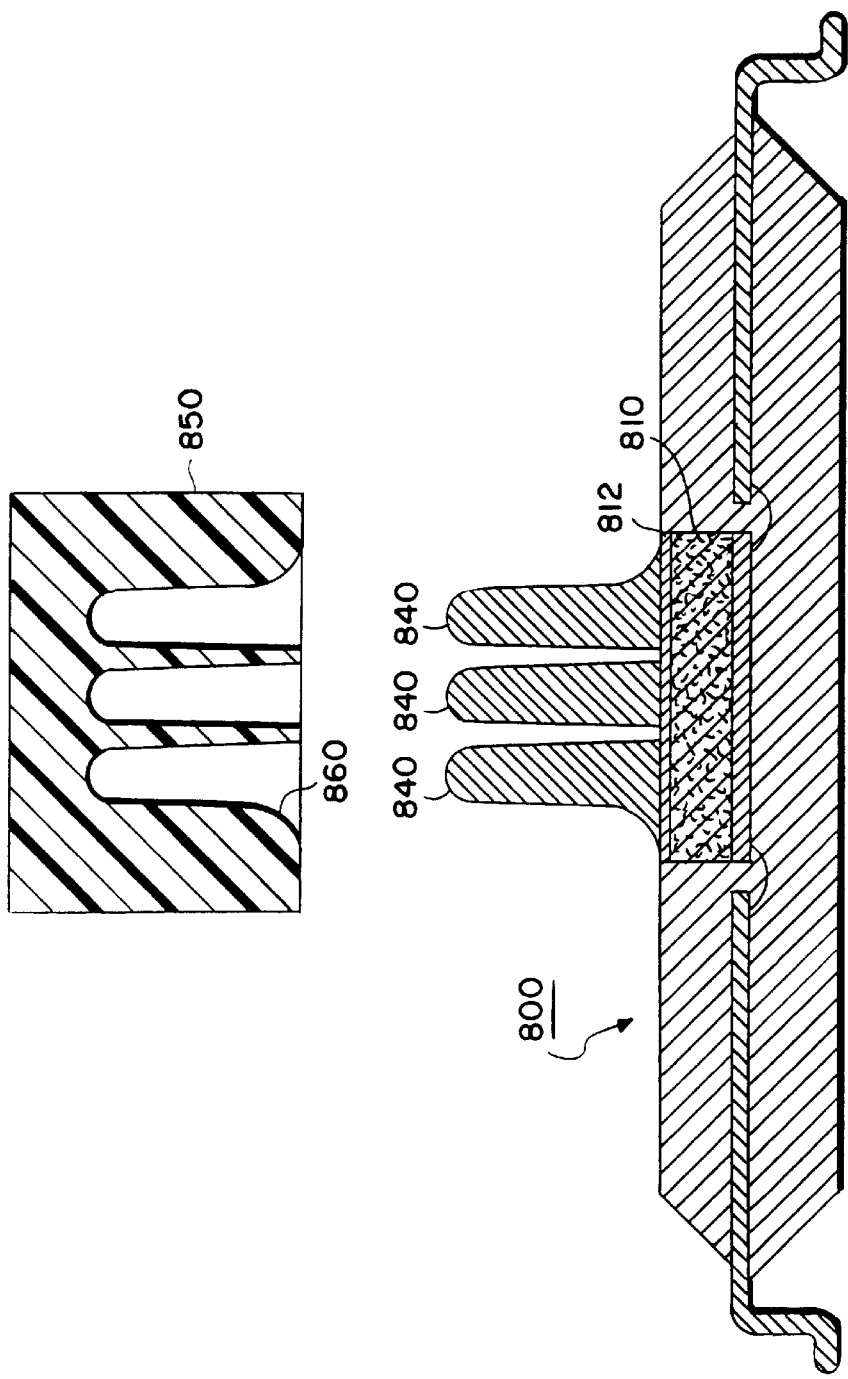
FIG. 8 is a cross-sectional view of the package with fins forms by a mold.

In yet another embodiment of the invention, as shown in FIGS. 8, fins 840 are formed by a mold 850 having a relief 860 which is a negative of the external dimensions of the desired fins 840. The internal surface of the relief 860 is made of a material which does not wet or adhere to a solder or other molding material. The relief 860 is filled with the mold material, and the mold material is, optionally, allowed to solidify. The mold 850 is placed against a die 810, possibly having a metalized layer 812. Heat is applied to the mold 850 to reflow the mold material and then cooled until the solder sets again. The mold 850 is removed, leaving behind the finned package 800. Alternatively, the mold material can be, for example, a time-cured epoxy.

Figure 9:
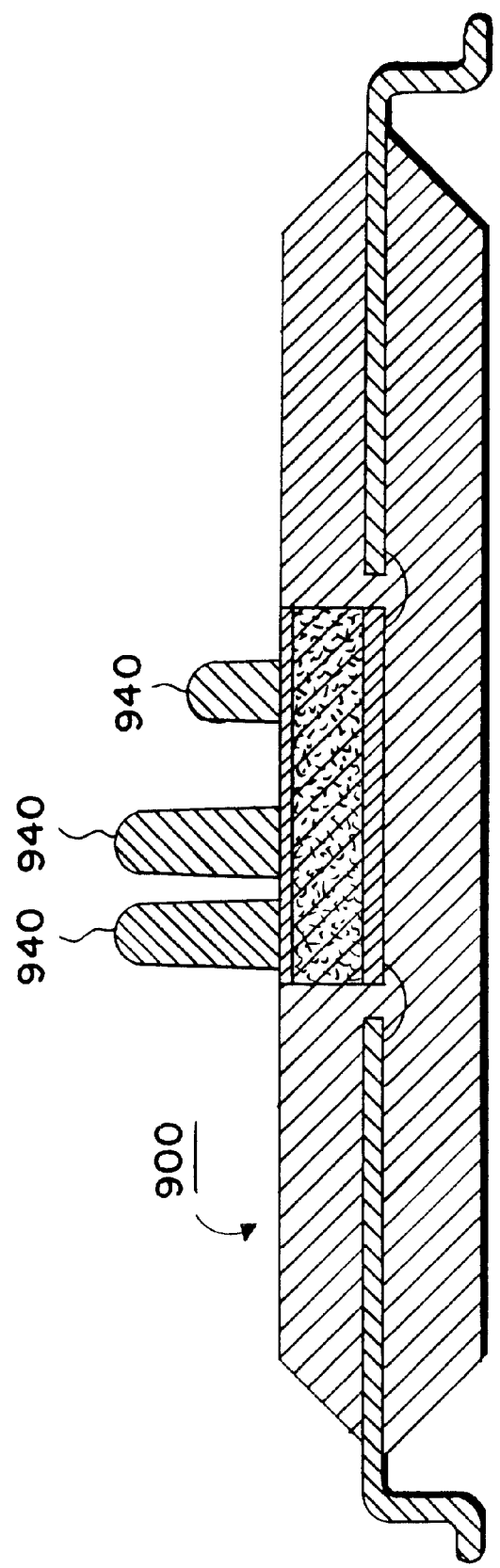
FIG. 9 is a cross-sectional view of the package of FIG. 8 with an alternative arrangement of molded fins.
Figure 10:
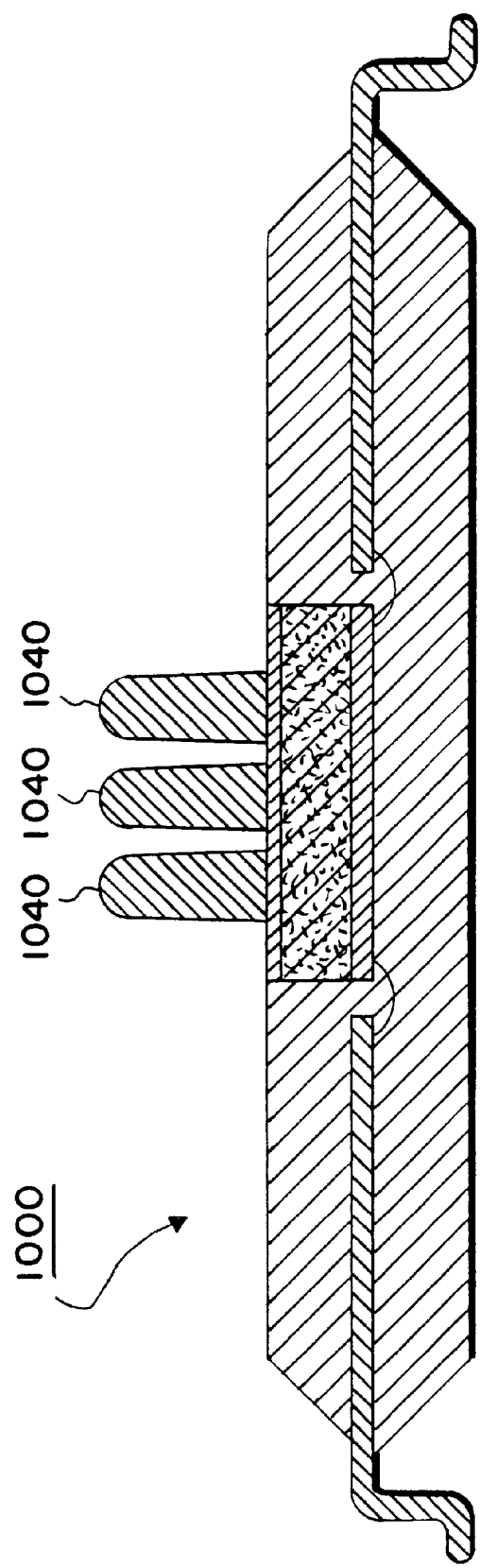
FIG. 10 is a cross-sectional view of the package of FIG. 8 with another alternative arrangement of molded fins.

FIGS. 9 and 10 show packages 900 and 1000 having molded fins 940 and 1040, respectively. The fins 940 and 1040 have geometries and arrangements for optimal heat removal performance. Also, in accordance with the principles of the invention, the fins are mounted independently without sharing a common base.

Figure 11:
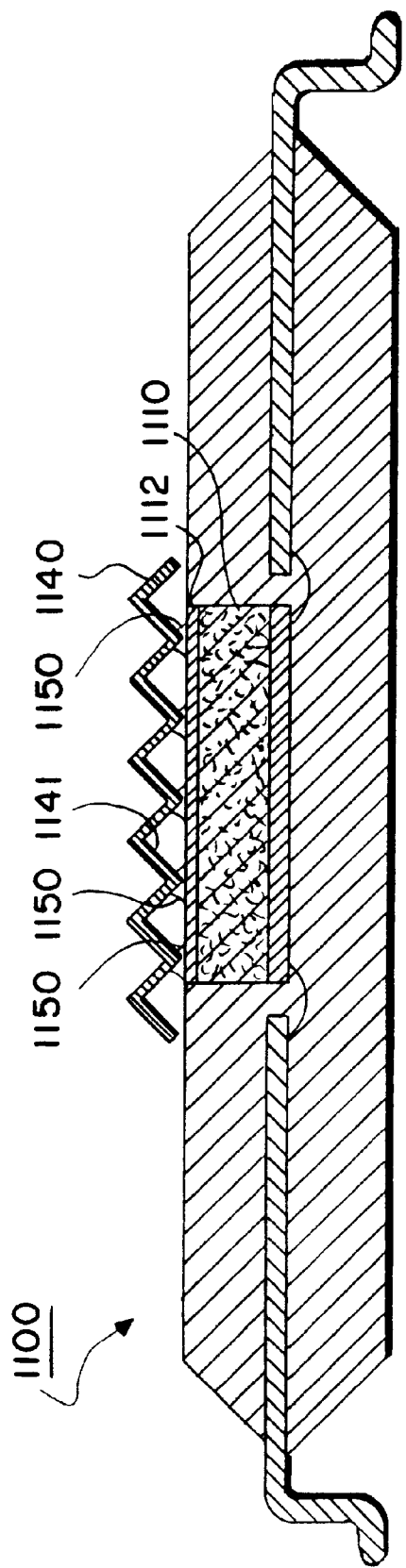
FIG. 11 is a cross sectional view of the package of FIG. 1 with a corrugated fin attached to a die intermittently.

Instead of fins being arranged perpendicularly to the plane of the package, a fin 1140, as shown in FIG. 11, can be position in a plane which is substantially parallel to the package to reduce the overall vertical dimensions of the assembly. The fin 1140 can be formed of a perforated stock having, for example, a corrugated or waved shape. In this embodiment, the fin 1140 is intermittently attached to a die 1110 by attachment means 1150 at corrugating bends of a side surface 1141 of the stock 1140 facing the die 1110. The die 110 can include a metalized layer 1112. The corrugation not only increases the size of the heat dissipating surfaces, but also, decreases lateral stiffness. The attachment means 1150 can be a thermal adhesive, or metalized joints.

Figure 12:
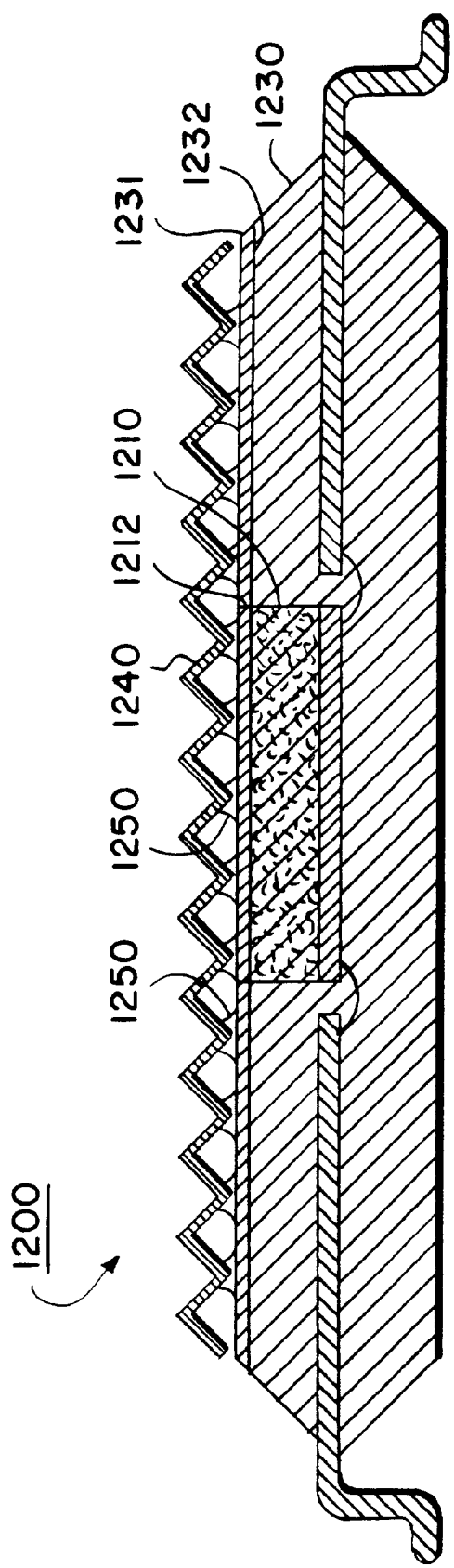
FIG. 12 is a cross-sectional view of an alternative embodiment of the fin of FIG. 11.

FIG. 12 shows a variation of the embodiment shown in FIG. 11. A die 1210, optionally having a first metalized layer 1212 is mounted in a package 1230. A second metalized layer 1231 can be formed on an external surface 1232 of the package 1230. The first metalized layer 1212 and the second metalized layer 1231 are substantially coplanar. A fin 1240 having a corrugated shape is attached to the metalized layer 1212 of the die 1210, and to the metalized layer 1231 of the package 1230 by attachment means 1250. In this arrangement, the area of the fin 1240 can be increased to conform with the dimensions of the surface 1232 of the package 1230 yielding a larger heat dissipating surface. The size of the cooling surface can be further increased if multiple corrugated fins are stacked and attached in parallel layers forming a honeycomb like structure.

Figure 13:
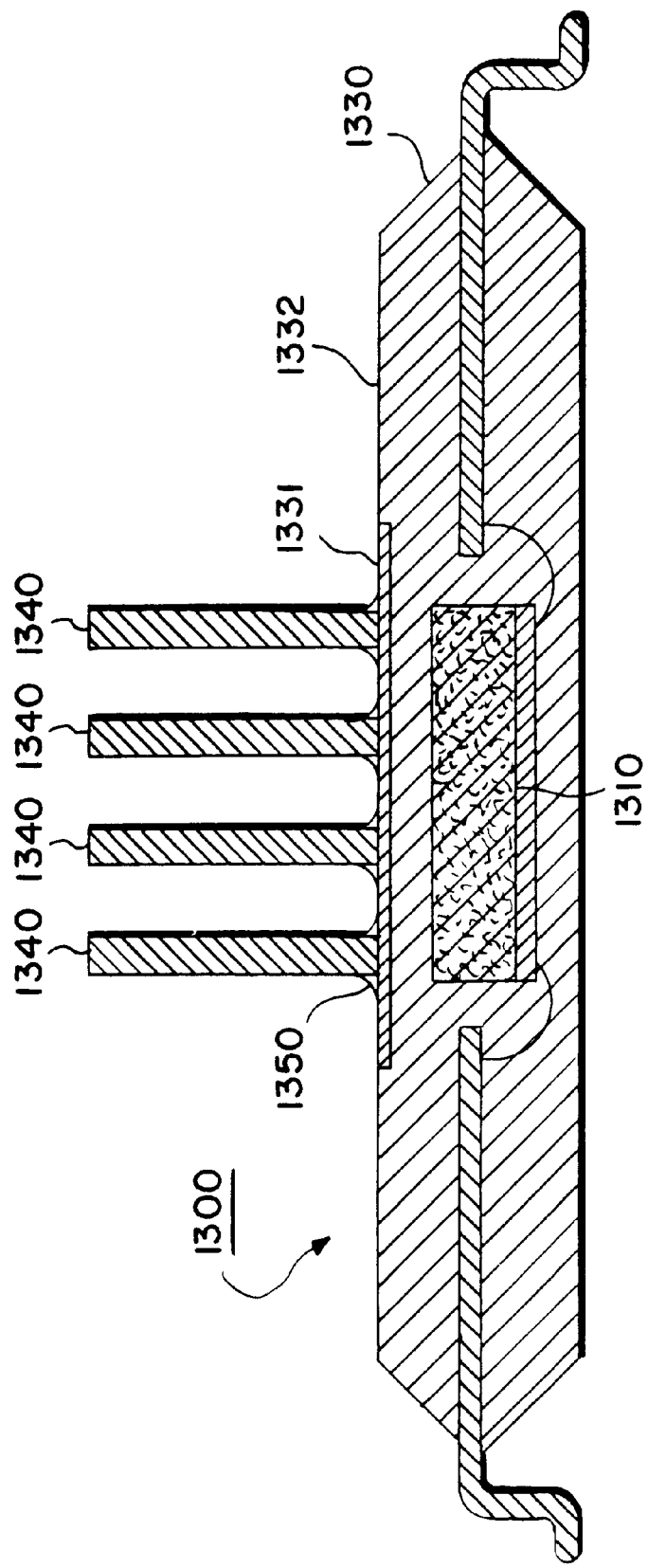
FIG. 13 is a cross-sectional view of a package having an embedded die and fins independently mounted on the package.

In the semiconductor package 1300 shown in FIG. 13, a die 1310 is entirely embedded within a package body 1330. An optional metalized layer 1331 is formed on a side surface 1332 of the package 1330. In this embodiment of the invention, fins 1340, configured as described above, are independently, and directly mounted on the metalized layer 1332 of the package 1330 by attachment means 1350. The fins 1340 can have any of the configurations and arrangements as shown in the FIGS. 2–12 to produce a relatively low-stress thermal bond between the fins 1340 and the package 1330. The thermal path can be shortened by minimizing the distance between the internal die 1310, and the external surface of the package 1330.

Figure 14:
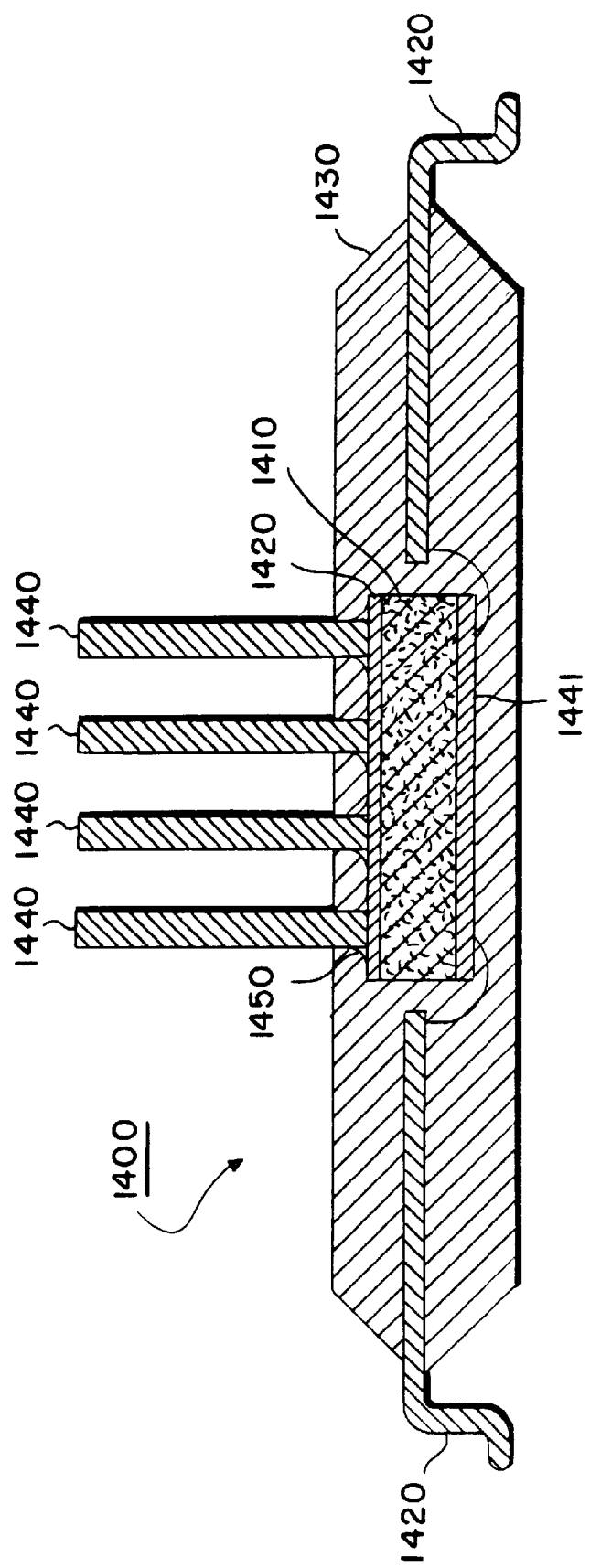
FIG. 14 is a cross-sectional view of the package of FIG. 13 with fins mounted on the embedded die.

FIG. 14 shows a variation of the embodiment of FIG. 13. A die 1410 has an optional metalized layer 1412 formed on a side surface opposing the side carrying circuits 1411. A lead frame 1420 is connected to the circuits 1411 by bond wires 1421. Fins 1440 are attached to the die or the metalized layer by attachment means 1450. A package body 1430 is, for example, molded around the die 1410, the lead frame 1420, and the fins 1440. This arrangement also provides for a short thermal path, and a low stress thermal joint between the die 1410 and the fins 1440. if the package 1430 is made of fused ceramic material, the ceramic can be provided with throughholes to receive the fins.

Figure 15:
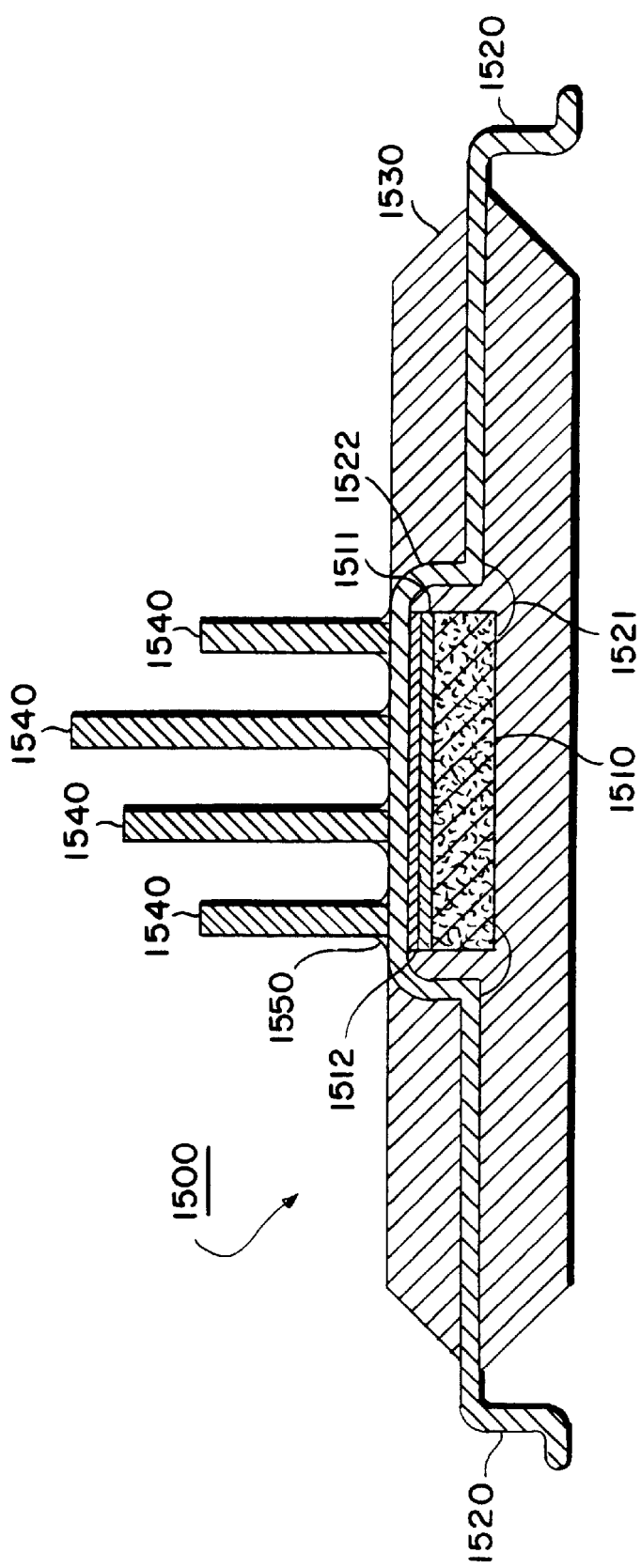
FIG. 15 is a cross-sectional view of a package with fins mounted on an externally exposed paddle of a lead frame.

Yet another variation is shown in FIG. 15. A die 1510 has circuits 1511 formed on one side surface. The die is connected to a lead frame 1520. The lead frame has a central opening in which is positioned a metalized paddle 1521. The purpose of the paddle is to maintain the die 1510 in a fixed location while bond wires 1522 are bonded to the circuits 1511 of the die. A package body 1530 is molded around the lead frame 1520, the die 1510, the paddle 1521, and the wires 1522 so that the surface of the paddle 1521 facing away from the die 1510 is coplanar with an external surface 1531 of the package 1530. Fins 1540 are directly attached to the paddle 1521 by attachment means 1550, as described above.

Figure 16:
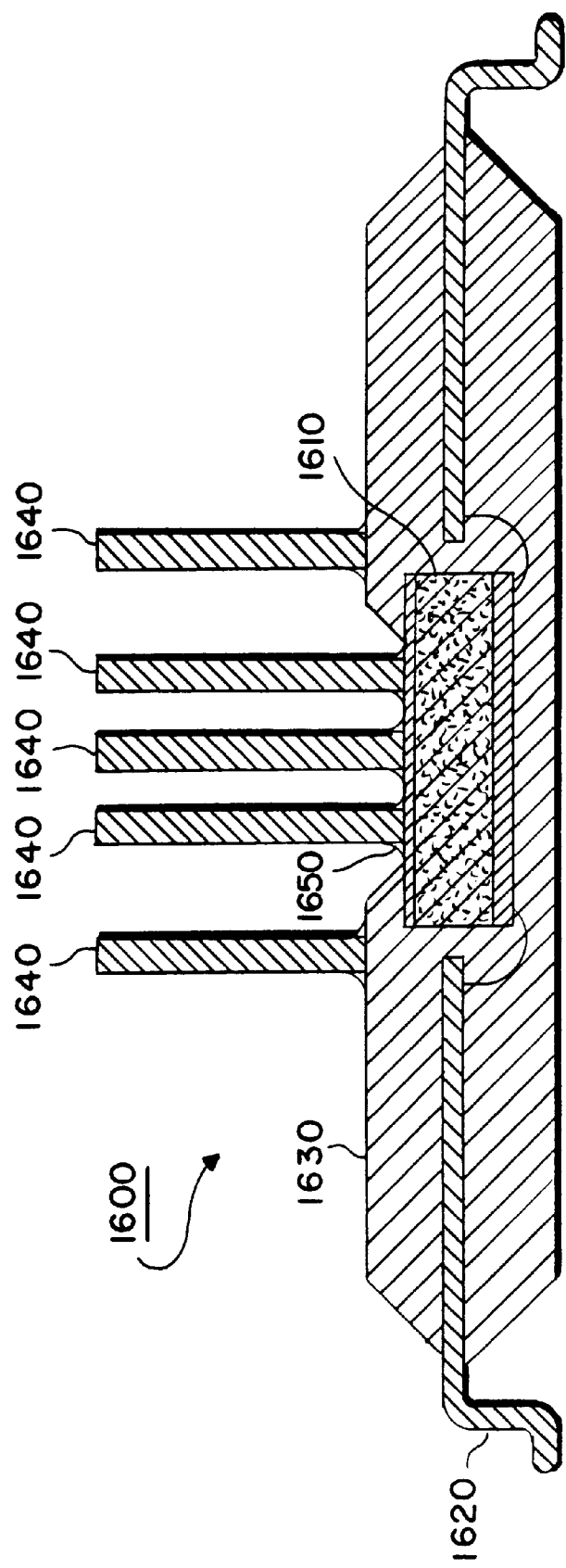
FIG. 16 is a cross-sectional view of a package with fins mounts on a die exposed within a relief of a package.

FIG. 16 shows another embodiment of the invention. A package 1600 has a partially embedded die 1610. The die 1610 is attached to leads 1620. The external body of a body 1630 of the package 1600 includes a relief 1650. A side surface of the die can be partially exposed within the relief 1650. Fins 1640 can be independently attached to the die 1610 and the package body 1630. If the fins 1640 are made of a metallic material, the surface of the die 1610 and the body 1630 where the fins 1640 are attached can be metalized.

Disclosed are illustrative embodiments of the invention which independently mount fins directly on a semiconductor die or package body to produce a semiconductor package which is less likely to fail due to thermal stress. In addition, the arrangements as shown, and described, reduce the length of the thermal path to provide better heat dissipation characteristics, and a lower profile of the package.

The invention is described using specific terms and examples. It is to be understood that various other adaptations and modifications may be made within the spirit and scope of the invention. Therefore, it is the object of the appended claims to cover such all such variations and modifications as come within the true spirit and scope of the invention.

What is claimed is:

1. A semiconductor package, comprising:

a die including electrical circuits;

means for connecting the electrical circuits to a power source;

a package made of a dielectric material, the package having the die and the means for connecting mounted therein such that a portion of the die forms an exterior surface of the package;

a plurality of independent fins to dissipate heat into an environment external to the package, the plurality of independent fins made of a thermally conductive material; and means for independently attaching each of the plurality of independent fins to the portion of the die which forms the exterior surface of the package to provide a direct thermal path between the die and the plurality of independent fins positioned entirely outside the package to provide a low stress thermal joint between the plurality of independent fins and the die.

2. The semiconductor package as in claim 1 wherein the portion of the die which forms the exterior surface of the package includes a metalized layer, the plurality of independent fins are attached to the metalized layer, and the means for attaching is one of a solder and a brazing.

3. The semiconductor package of claim 1 wherein the plurality of independent fins are substantially perpendicular to the package.

4. The semiconductor package of claim 1 wherein each of the plurality of independent fin are in the form of a heat pipe having an internal cavity.

5. The semiconductor package as of claim 1 wherein the plurality of independent fins are attached to the die in accordance with a predetermined power distribution of the die to selectively control the heat gradient of the die.

* * * * *

UNITED STATES PATENT AND TRADEMARK OFFICE
CERTIFICATE OF CORRECTION

PATENT NO. : 6,208,513 B1
DATED : March 27, 2001
INVENTOR(S) : Fitch et al.

It is certified that error appears in the above-identified patent and that said Letters Patent is hereby corrected as shown below:

Claim 4, column 6,
Line 30, reads, "the plurality of independent fin are in the form of a heat pipe" it should read -- the plurality of independent fins are in the form of a heat pipe --;

Signed and Sealed this

Eleventh Day of December, 2001

*Attest:*

*Attesting Officer*

NICHOLAS P. GODICI
*Acting Director of the United States Patent and Trademark Office*